United States Patent
Horn et al.

(10) Patent No.: US 12,276,917 B2
(45) Date of Patent: Apr. 15, 2025

(54) MIRROR, IN PARTICULAR FOR MICROLITHOGRAPHY

(71) Applicant: Carl Zeiss SMT GmbH, Oberkochen (DE)

(72) Inventors: Jan Horn, Munich (DE); Mohammad Awad, Heidenheim (DE); Kerstin Hild, Waldstetten (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 221 days.

(21) Appl. No.: 17/994,472

(22) Filed: Nov. 28, 2022

(65) Prior Publication Data
US 2023/0088791 A1   Mar. 23, 2023

Related U.S. Application Data

(63) Continuation of application No. PCT/EP2021/060759, filed on Apr. 23, 2021.

(30) Foreign Application Priority Data

May 28, 2020   (DE) .................... 10 2020 206 708.2

(51) Int. Cl.
  *G03F 7/00*    (2006.01)
  *G02B 26/08*   (2006.01)
  (Continued)

(52) U.S. Cl.
  CPC ..... *G03F 7/70266* (2013.01); *G02B 26/0858* (2013.01); *G03F 7/70316* (2013.01);
  (Continued)

(58) Field of Classification Search
  CPC ............ G03F 7/70266; G03F 7/70316; G03F 7/70891; G03F 7/70175; G03F 7/702;
  (Continued)

(56) References Cited

U.S. PATENT DOCUMENTS

| | | |
|---|---|---|
| 4,533,449 A | 8/1985 | Levenstein |
| 6,441,963 B2 | 8/2002 | Murakami et al. |

(Continued)

FOREIGN PATENT DOCUMENTS

| | | |
|---|---|---|
| DE | 102011081603 A1 | 10/2012 |
| DE | 102012215359 A1 | 3/2014 |

(Continued)

OTHER PUBLICATIONS

International Search Report, PCT/EP2021/060759, Jul. 30, 2021, 4 pages.

(Continued)

*Primary Examiner* — Christina A Riddle
(74) *Attorney, Agent, or Firm* — Edell, Shapiro & Finnan, LLC

(57) ABSTRACT

A mirror including a substrate (110), a reflection layer system (120), and at least one continuous piezoelectric layer (130, . . . ) arranged between the substrate and the layer system. An electric field producing a locally variable deformation is applied to the piezoelectric layer via a first, layer-system-side electrode arrangement and a second, substrate-side electrode arrangement. At least one of the electrode arrangements is assigned a mediator layer (170) setting an at least regionally continuous profile of the electrical potential along the respective electrode arrangement. The electrode arrangement to which the mediator layer is assigned has a plurality of electrodes (160, . . . ), each of which is configured to receive an electrical voltage relative to the respective other electrode arrangement. In the region that couples two respectively adjacent electrodes, the mediator layer is subdivided into a plurality of regions (171, . . . ) that are electrically insulated from one another.

19 Claims, 10 Drawing Sheets

(51) Int. Cl.
*G21K 1/06* (2006.01)
*H10N 30/00* (2023.01)
*H10N 30/853* (2023.01)
*H10N 30/87* (2023.01)

(52) U.S. Cl.
CPC .......... *G21K 1/062* (2013.01); *H10N 30/708* (2024.05); *H10N 30/8554* (2023.02); *H10N 30/87* (2023.02)

(58) Field of Classification Search
CPC .... G03F 7/70308; G03F 7/70958; G03F 7/70; G03F 7/70091; G03F 7/70125; G03F 7/70141; G03F 7/7015–70183; G03F 7/70191; G03F 7/70566; G03F 7/70575; G03F 7/70258; G03F 7/7095; G03F 7/70966; G02B 26/0858; G02B 26/0825; G02B 5/0891; G02B 27/0068; G02B 26/06; G02B 26/0816; G02B 5/0816; G21K 1/062; G21K 2201/061; G21K 2201/067; H10N 30/708; H10N 30/8554; H10N 30/87; H10N 30/206; H10N 30/50; H10N 30/704; H10N 30/802; C03C 17/10
USPC ........ 250/372, 492.1, 492.2, 492.22, 492.23, 250/493.1, 503.1, 504 R; 355/18, 30, 355/52–55, 67–77; 359/350, 351, 359/359–360, 290–291, 295, 315–316, 359/321–324
See application file for complete search history.

(56) References Cited

U.S. PATENT DOCUMENTS

| | | | |
|---|---|---|---|
| 6,858,537 | B2 | 2/2005 | Brewer |
| 9,190,239 | B2 | 11/2015 | Chung et al. |
| 9,442,383 | B2 | 9/2016 | Dinger et al. |
| 11,360,393 | B2 | 6/2022 | Wylie-Van Eerd et al. |
| 11,366,395 | B2 | 6/2022 | Hild et al. |
| 11,809,085 | B2 * | 11/2023 | Stiepan .............. G02B 26/0858 |
| 2014/0285783 | A1 * | 9/2014 | Dinger ................. G02B 5/0891 359/359 |
| 2016/0209751 | A1 | 7/2016 | Gruner et al. |
| 2021/0055662 | A1 * | 2/2021 | Hild ....................... G02B 5/085 |
| 2022/0113634 | A1 | 4/2022 | Stiepan et al. |

FOREIGN PATENT DOCUMENTS

| | | |
|---|---|---|
| DE | 102013219583 A1 | 4/2015 |
| DE | 102015213273 A1 | 1/2017 |
| DE | 102016201445 A1 | 2/2017 |
| DE | 102017217695 A1 | 6/2018 |
| DE | 102017203647 A1 | 9/2018 |
| DE | 102017213900 A1 | 2/2019 |
| DE | 102018207146 A1 | 11/2019 |
| DE | 102019208934 A1 | 12/2020 |
| WO | 2013057046 A1 | 4/2013 |
| WO | 2017009096 A1 | 1/2017 |
| WO | 2020254147 A1 | 12/2020 |

OTHER PUBLICATIONS

Pei et al., "Microstructural control of TiC/a-C nanocomposite coating with pulsed magnetron sputtering", publication date 2008, pp. 696-709.

Pei et al, "Growth of nanocomposite films: From dynamic roughening to dynamic smoothening", ScienceDirect, Acta Materialia 57 (2009), pp. 5156-5164.

Kloidt, et al., "Smoothing of interfaces in ultrathin Mo/Si multilayers by ion bombardment", Thin Solid Films, 228 (1993), pp. 154-157.

Huth et al., "Focused electron beam induced deposition: A perspective", Beilstein Journal of Nanotechnology, published, Aug. 29, 2012, pp. 597-619.

Henke et al., "Flash-Enhanced Atomic Layer Deposition: Basics, Opportunities, Review, and PrincipalStudies on the Flash-Enhanced Growth of Thin Films", ESC Journal of Solid State Science and Technology, 4(7) 2015, pp. P277-P287.

Gerke et al., "Bias-plasma assisted RF magnetron sputter deposition of hydrogen-less amorphous silicon", Energy Procedia 85, 2015, pp. 105-109.

Cordoba, et al., "Ultra-fast direct growth of metallic micro-and nano-structures by focused ion beam irradiation", Scientific Reports, published online Oct. 1, 2019, 10 pages.

Chason et al., "Kinetics of Surface Roughening and Smoothing During Ion Sputtering", Materials Research Society Symp. Proc., vol. 317, 1994, pp. 91-102.

Chalker, "Photochemical atomic layer deposition and etching", Surface & Coating Technology 291 (2016), pp. 258-263.

Utke, et al., "Gas-assisted focused electron beam and ion beam processing and fabrication", American Vacuum Society, Jul./Aug. 2008, pp. 1197-1276.

Roozeboom, et al., "Cyclic Etch/Passivation-Deposition as an All-Spatial Concept toward High-Rate Room Temperature Atomic Layer Etching", ECS Journal of Solid State Science and technology, 4(6), published Apr. 7, 2015, pp. N5067-N5076.

Randolph, et al, "Focused, Nanoscale Electron-Beam-Induced Deposition and Etching", Critical Reviews in Solid State and Materials Sciences, (2006), 31:pp. 55-89.

International Preliminary Report on Patentability, PCT/EP2021/060759, Nov. 17, 2022, 18 pages.

German Office Action with English translation, Application No. 10 2020 206 708.2, Nov. 19, 2020, 10 pages.

\* cited by examiner

MIRROR, IN PARTICULAR FOR MICROLITHOGRAPHY

CROSS REFERENCE TO RELATED APPLICATIONS

This is a Continuation of International Application PCT/EP2021/060759, which has an international filing date of Apr. 23, 2021, and which claims the priority of German Patent Application 10 2020 206 708.2, filed May 28, 2020. The disclosures of both applications are incorporated in their respective entireties into the present Continuation by reference.

FIELD OF THE INVENTION

The invention relates to a mirror, in particular for microlithography.

BACKGROUND

Microlithography is used for producing microstructured components, such as for example integrated circuits or liquid crystal devices (LCDs). The microlithography process is carried out in what is known as a projection exposure apparatus, which includes an illumination device and a projection lens. The image of a mask (=reticle) illuminated with the illumination device is projected here via the projection lens onto a substrate (e.g. a silicon wafer) coated with a light-sensitive layer (=photoresist) and disposed in the image plane of the projection lens, in order to transfer the mask structure to the light-sensitive coating of the substrate.

In projection lenses designed for the extreme ultraviolet (EUV) range, i.e. at wavelengths of e.g. approximately 13 nm or approximately 7 nm, mirrors are used as optical components for the imaging process owing to the lack of availability of suitable light-transmissive refractive materials.

In this case, it is also known, in order to compensate for optical aberrations e.g. owing to thermal deformations in the case of EUV radiation incident on the optical effective surface, to configure one or more mirrors in an EUV system as an adaptive mirror with an actuator layer composed of a piezoelectric material, wherein an electric field having a locally varying strength is generated across this piezoelectric layer by an electrical voltage being applied to electrodes arranged on both sides with respect to the piezoelectric layer. In the case of a local deformation of the piezoelectric layer, the reflection layer system of the adaptive mirror also deforms, with the result that, for example, imaging aberrations (possibly also temporally variable imaging aberrations) can be at least partly compensated for by suitable driving of the electrodes.

In this case, it is furthermore known to use a mediator layer that is in direct electrical contact with the electrodes of one of the electrode arrangements to "mediate" between the electrodes in terms of potential. The mediator layer itself has only a low electrical conductivity with the consequence that a potential difference between adjacent electrodes is dropped substantially across the mediator layer.

In order to explain the functioning of such a mediator layer, the schematic illustration in FIG. 9 shows an equivalent circuit diagram, in which an electric field for producing a locally variable deformation is able to be applied to a piezoelectric layer 930 via a first electrode arrangement (which comprises a plurality of mutually independently drivable electrodes 960) and a second electrode arrangement (which is embodied as a continuous electrode 940). Out of the electrodes 960 of the first electrode arrangement, only two electrodes 960 are illustrated in FIG. 9, driver amplifiers for applying electrical voltage to the electrodes 960 being designated by "966".

In accordance with the equivalent circuit diagram in FIG. 9, the mediator layer mentioned above can be modeled as a continuous voltage divider composed of a plurality of ohmic resistances $R_{med}$. In the case of the schematic equivalent circuit diagram in FIG. 9, in a simple calculation example, for instance, this ohmic voltage division by the mediator layer has the effect that in the case where a voltage of 10 V is applied to the left electrode 960 and 0 V is applied to the right electrode 960, a voltage of 2.5 V is in each case dropped across each of the four ohmic resistances $R_{med}$ situated therebetween, with the consequence that the voltage values present at the piezoelectric layer 930 amount to $Vi1=7.5V$, $Vi2=5V$ and $Vi3=2.5V$, that is to say that a voltage interpolation (which is quasi-continuous given a correspondingly high number of ohmic resistances $R_{med}$) is achieved.

One problem that occurs in practice, however, is that, in association with the voltage profile described above, an electric current flow in the mediator layer (of e.g. an order of magnitude of 20 mA-100 mA) results in significant power losses, which can be in the kW range and in turn result in undesired thermal effects, in particular a thermally induced deformation. Furthermore, the electric currents flowing in the mediator layer result in demanding requirements in respect of the driving electronics and also the required leads.

A setting of a comparatively high electrical sheet resistance of the mediator layer (of e.g. 100 kΩ), which setting is desirable in principle in order to limit undesired evolution of heat on account of the electrical power generated in the mediator layer as a result of electric current being applied to the electrode arrangements, has the effect, on the other hand, that the propagation of the electrical potential in the mediator layer would take place too slowly in certain scenarios (e.g. upon taking account of thermally induced mask deformations in the lithography process).

As a result, it is a demanding challenge to harmonize the avoidance of thermal problems (by setting the highest possible electrical resistance of the mediator layer) with a rapid reaction capability (e.g. within milliseconds (ms)) when setting the desired surface shape of the adaptive mirror (by setting a correspondingly low electrical resistance of the mediator layer).

Regarding the prior art, reference is made merely by way of example to DE 10 2013 219 583 A1 and DE 10 2015 213 273 A1.

SUMMARY

It is an object of the present invention to provide a mirror, in particular for microlithography, which, on the basis of the principle of the locally varying deformation of a piezoelectric layer, enables aberrations in an optical system to be corrected as optimally as possible while at least largely avoiding the problems described above.

This object is achieved in accordance with the features recounted herein in accordance with the independent patent claims.

A mirror according to the invention, in particular for a microlithographic projection exposure apparatus, wherein the mirror has an optical effective surface, comprises:

a mirror substrate;

a reflection layer system for reflecting electromagnetic radiation incident on the optical effective surface; and at least one continuous piezoelectric layer which is arranged between mirror substrate and reflection layer system and to which an electric field for producing a locally variable deformation is able to be applied via a first electrode arrangement, which is situated on the side of the piezoelectric layer facing the reflection layer system, and a second electrode arrangement, which is situated on the side of the piezoelectric layer facing the mirror substrate;

wherein at least one of said electrode arrangements is assigned a mediator layer for setting an at least regionally continuous profile of the electrical potential along the respective electrode arrangement;

wherein said electrode arrangement to which the mediator layer is assigned has a plurality of electrodes, to each of which it is possible to apply an electrical voltage relative to the respective other electrode arrangement; and wherein the mediator layer is structured in such a way that, in the region that couples in each case two electrodes adjacent to one another, said mediator layer is subdivided into a plurality of regions that are electrically insulated from one another.

In the context of the present application, the term "reflection layer system" should be deemed to encompass both multilayer systems or reflection layer stacks and monolayers.

According to one aspect of the present invention, a mediator layer used for smoothing the voltage profile in an adaptive mirror provided with a piezoelectric layer is not realized as a resistive voltage divider, as described in the introduction. Rather, it is realized as a capacitive voltage divider with the consequence that—as also explained in greater detail below with reference to the equivalent circuit diagram in FIG. 3—an electric current flows in the mediator layer only in the event of a change in the voltage profile or deformation profile, that is to say that the steady-state current flow and associated electrical power losses in the mediator layer as described in the introduction are avoided.

The configuration according to the invention of the mediator layer as a capacitive voltage divider is achieved by the mediator layer being structured insofar as it has a plurality of regions that are electrically insulated from one another. Relative to the electrode arrangement that is constructed from a plurality of electrodes and is assigned to the mediator layer, this structuring is effected in such a way that the region that couples in each case two electrodes of said electrode arrangement that are adjacent to one another is subdivided into a plurality of regions that are electrically insulated from one another. As a result, as described below, a capacitive voltage division is effectively realized which brings about the desired voltage interpolation without the undesired current flow in the steady state of the adaptive mirror, described in the introduction.

According to the invention, in this case, with regard to the structuring of the mediator layer from a production engineering standpoint an increased outlay is deliberately accepted in order, in return, to avoid or at least alleviate the problems described in the introduction owing to high electric currents flowing in the mediator layer and/or in the leads to the electrodes of the assigned electrode arrangement in the steady state of the adaptive mirror.

In accordance with one embodiment, the number of regions that are electrically insulated from one another in the region of the mediator layer that couples in each case two electrodes adjacent to one another is more than 5, in particular more than 10, more particularly more than 20, more particularly more than 50.

In accordance with one embodiment, the number of regions that are electrically insulated from one another in the mediator layer is greater than the number of electrodes in the electrode arrangement to which the mediator layer is assigned by at least a factor of 2, in particular by at least a factor of 5, more particularly by at least a factor of 10.

In accordance with one embodiment, the regions of the mediator layer that are electrically insulated from one another form a hexagonal honeycomb structure.

In accordance with one embodiment, the regions of the mediator layer that are electrically insulated from one another form a rectangular structure.

In accordance with one embodiment, the regions of the mediator layer that are electrically insulated from one another are separated from one another by an electrically insulating material situated between said regions, in particular silicon dioxide ($SiO_2$) or $Al_2O_3$.

In accordance with one embodiment, said electrically insulating material has a proportion of less than 75%, in particular a proportion of less than 90%, of the total area of the mediator layer.

In accordance with one embodiment, the mirror is designed for an operating wavelength of less than 250 nm, in particular less than 200 nm.

In accordance with one embodiment, the mirror is designed for an operating wavelength of less than 30 nm, in particular less than 15 nm.

In accordance with one embodiment, the mirror is a mirror for a microlithographic projection exposure apparatus.

The invention furthermore relates to an optical system comprising at least one mirror having the features described above.

In accordance with one embodiment, the optical system is a projection lens or an illumination device of a microlithographic projection exposure apparatus.

In accordance with a further embodiment, the optical system is an inspection lens, especially an inspection lens of a wafer inspection apparatus or a mask inspection apparatus.

The invention furthermore also relates to a microlithographic projection exposure apparatus.

Further configurations of the invention are evident from the description and the dependent claims.

The invention is explained in greater detail below on the basis of exemplary embodiments illustrated in the accompanying figures.

BRIEF DESCRIPTION OF THE DRAWINGS

In the figures:

FIG. 4A shows electrical connections to electrodes in a honeycomb structure, FIG. 4B shows the same using capacitive couplings, FIG. 5 shows electrical connections arranged in a grid-like geometry, and FIG. 6 shows the same in a square geometry;

DETAILED DESCRIPTION

Figure 1:
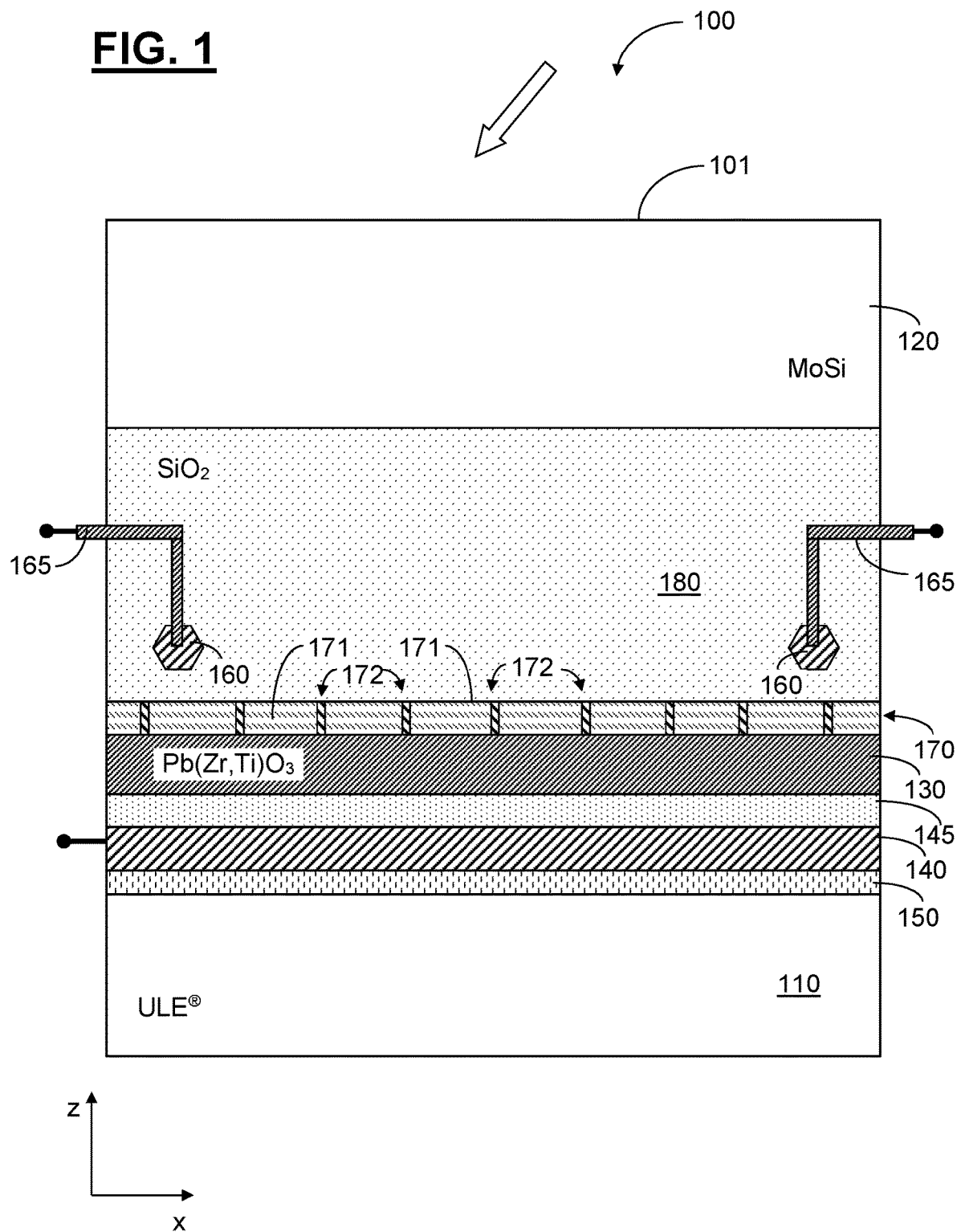
FIG. 1 shows a schematic illustration for explaining the construction of an adaptive mirror in accordance with one embodiment of the invention.

FIG. 1 shows a schematic illustration showing the construction of a mirror according to the invention in one exemplary embodiment of the invention. The mirror 100 comprises in particular a mirror substrate 110, which is produced from any desired suitable mirror substrate material. Suitable mirror substrate materials are e.g. titanium dioxide ($TiO_2$)-doped quartz glass, such as, merely by way of example, the material sold under the trademark ULE® (from Corning Inc.) and without the invention being restricted thereto). Further suitable materials are lithium aluminosilicate glass ceramics sold e.g. under the trademarks Zerodur® (from Schott AG) or Clearceram® (from Ohara Inc.). Particularly in applications outside EUV microlithography, other materials such as e.g. silicon (Si) are also feasible.

Furthermore, the mirror 100 has, in a manner known per se in principle, a reflection layer system 120, which, in the embodiment illustrated, comprises, merely by way of example a molybdenum-silicon (Mo—Si) layer stack. Without the invention being restricted to specific configurations of said reflection layer system, one suitable construction can comprise approximately 50 plies or layer packets of a layer system comprising molybdenum (Mo) layers having a layer thickness of in each case 2.4 nm and silicon (Si) layers having a layer thickness of in each case 3.3 nm. In further embodiments, the reflection layer system can also be a monolayer.

The mirror 100 can be in particular an EUV mirror of an optical system, in particular of the projection lens or of the illumination device of a microlithographic projection exposure apparatus.

The mirror 100 has a piezoelectric layer 130, which is produced from lead zirconate titanate ($Pb(Zr,Ti)O_3$, PZT) in the example. Electrode arrangements are respectively situated above and below the piezoelectric layer 130, via which electrode arrangements an electric field for producing a locally variable deformation is able to be applied to the mirror 100. Out of said electrode arrangements, the second electrode arrangement facing the substrate 110 is configured as a continuous, planar electrode 140 of constant thickness, whereas the first electrode arrangement has a plurality of electrodes 160, to each of which it is possible to apply an electrical voltage relative to the electrode 140 via a lead 165. The electrodes 160 are embedded into a common smoothing layer 180, which is produced e.g. from quartz ($SiO_2$) and serves for leveling the electrode arrangement formed from the electrodes 160. Furthermore, the mirror 100 has, between the mirror substrate 110 and the bottom electrode 140 facing the mirror substrate 110, an adhesion layer 150 (e.g. composed of titanium, Ti) and a buffer layer 145 (e.g. composed of $LaNiO_3$), which is arranged between the electrode arrangement 140 facing the substrate 110 and the piezoelectric layer 130 and which further supports the growth of PZT in an optimum, crystalline structure and ensures consistent polarization properties of the piezoelectric layer over the service life.

During operation of the mirror 100 or of an optical system comprising said mirror 100, applying an electrical voltage to the electrodes 140 and 160, by way of the electric field that forms, results in a deflection of the piezoelectric layer 130. In this way, it is possible—for instance for the compensation of optical aberrations e.g. owing to thermal deformations in the case of EUV radiation incident on the optical effective surface 101—to achieve an actuation of the mirror 100.

In accordance with FIG. 1, the mirror 100 furthermore has a mediator layer 170. Said mediator layer 170 serves to "mediate" between the electrodes 160 in terms of potential, wherein it has only a low electrical conductivity (preferably less than 200 siemens/meter (S/m)), with the consequence that a potential difference existing between adjacent electrodes 160 is dropped substantially across the mediator layer 170.

According to the invention, then, in the case of the adaptive mirror, the mediator layer 170 is not embodied as a layer that is electrically conductive in a planar continuous fashion, but rather is structured insofar as it has a plurality of regions 171 that are electrically insulated from one another. The electrically insulating sections for separating the individual regions 171 of the mediator layer 170 from one another are designated by "172" in FIG. 1.

This structuring can be realized in the exemplary embodiment—but without the invention being restricted thereto—by the mediator layer 170 being correspondingly structured lithographically during the production of the adaptive mirror 100, wherein electrically insulating material such as e.g. $SiO_2$ or $Al_2O_3$ is introduced between the regions 171 that are separated from one another during said structuring. In further embodiments, the structuring of the mediator layer 170 with regions 171 that are electrically insulated from one another can also be effected using other suitable material-removing processing processes such as atomic layer etching (ALE="Atomic Layer Etching") and material-adding (i.e. additive) processing processes such as atomic layer deposition (ALD="Atomic Layer Deposition"), wherein these processing technologies can optionally also be integrated into one and the same processing head. During the manufacturing of the adaptive mirror 100 or structuring of the mediator layer 170, in principle each process step of the manufacturing process can comprise one or more of the "elementary processes" of deposition, removal, smoothing, structuring, wherein these elementary processes can proceed sequentially or simultaneously. Furthermore, each of these elementary processes can have a global effect (i.e. on the entire processed surface) and/or a locally selective effect. Examples of methods having a global effect are photolithographic methods and freeform coating (as known e.g. from DE 10 2012 215 359 A1). Examples of methods having a locally selective effect are IBF ("Ion Beam Figuring") or magnetron sputtering using a movable "mini-magnetron head" (as known e.g. from U.S. Pat. No. 4,533,449 A).

For deposition purposes, it is possible to use any suitable method such as e.g. physical vapor deposition (PVD="Physical Vapor Deposition"), in particular magnetron sputtering, ion beam sputtering or pulsed laser beam evaporation (PLD="Pulsed Laser Deposition"), chemical vapor deposition (CVD="Chemical Vapour Deposition") or atomic layer deposition (ALD="Atomic Layer Deposition"), in particular spatial atomic layer deposition (spatial ALD). In this case, it is possible to use all suitable derivatives (thermally assisted, plasma enhanced, electron beam assisted and ion beam assisted) (as known e.g. from the publications M. Huth et al.: "Focused electron beam induced deposition: A perspective", Beilstein J. Nanotechnol., 3, 597-619, 2012 and R. Cordoba: "Ultra-fast direct growth of metallic micro- and nano-structures by focused ion beam irradiation" Scientific Reports 9, 14076, 2019). Furthermore, it is also possible to use laser assisted methods (as known from P. R. Chalker: "Photochemical atomic layer deposition and etching" Surface & Coatings Technology 291, 258-263, 2016), or flash ("flash-lamp")-enhanced methods (as known e.g. from T. Henke: "Flash-Enhanced Atomic Layer Deposition", ECS J. Solid State Sci. Technol. 4, P277-P287, 2015).

Removal or smoothing can be effected using an ion beam, a plasma, a reactive plasma, a reactive ion beam, a plasma jet, a remote plasma method, atomic layer etching, in particular spatial atomic layer etching, electron beam assisted etching, etc. In this case, it is possible to use any conventional method, such as e.g. ion smoothing (as known e.g. from U.S. Pat. No. 6,441,963 B2 and also the publications A. Kloidt et al: "Smoothing of interfaces in ultrathin Mo/Si multilayers by ion bombardment", Thin Solid Films 228 154-157, 1993, and E. Chason et al: "Kinetics Of Surface Roughening And Smoothing During Ion Sputtering", Mat. Res. Soc. Symp. Proceedings Vol. 317, 91, 1994), plasma enhanced chemical etching (as known e.g. from U.S. Pat. No. 6,858,537 B2), plasma immersion smoothing (as known e.g. from U.S. Pat. No. 9,190,239 B2), bias-plasma assisted smoothing (as known e.g. from S. Gerke et al.: "Bias-plasma assisted RF magnetron sputter deposition of hydrogen-less amorphous silicon", Energy Procedia 84, 105-109, 2015) or pulsed DC magnetron sputtering (as known e.g. from Y. T. Pei: "Growth of nanocomposite films: From dynamic roughening to dynamic smoothening", Acta Materialia, 57, 5156-5164, 2009).

It is also possible to use methods which can be used simultaneously for a plurality of elementary processes such as deposition and/or removal and/or smoothing, for example spatial atomic layer processing (as known e.g. from F. Roozeboom: "Cyclic Etch-Passivation-Deposition as an All-Spatial Concept toward High-Rate Room Temperature Atomic Layer Etching" ECS J. Solid State Sci. Technol. 4, N5067-N5076, 2015) or focused electron beam and ion beam processing—FEBIP/FIBIP (as known e.g. from S. J. Randolph et al: "Focused, Nanoscale Electron-Beam-Induced Deposition and Etching" Critical Reviews in Solid State and Materials Science 31, 55-89, 2006, or I. Utke et al: "Gas-assisted focused electron beam and ion beam processing and fabrication", J. of Vac. Sci. & Technol. B 26:4, 1197-1276, 2008).

As evident from FIG. 1, the mediator layer 170 is structured in such a way that, in the region that couples in each case two electrodes 160 adjacent to one another, said mediator layer 170 is subdivided into a plurality of regions 171 that are electrically insulated from one another. In other words, the path leading from one electrode 160 to the respective closest adjacent electrode 160 via the mediator layer 170 runs via a plurality of electrically insulating sections 172. This configuration corresponds to the realization of a capacitive voltage divider in accordance with the equivalent circuit diagram in the schematic illustration in FIG. 3.

Figure 9:
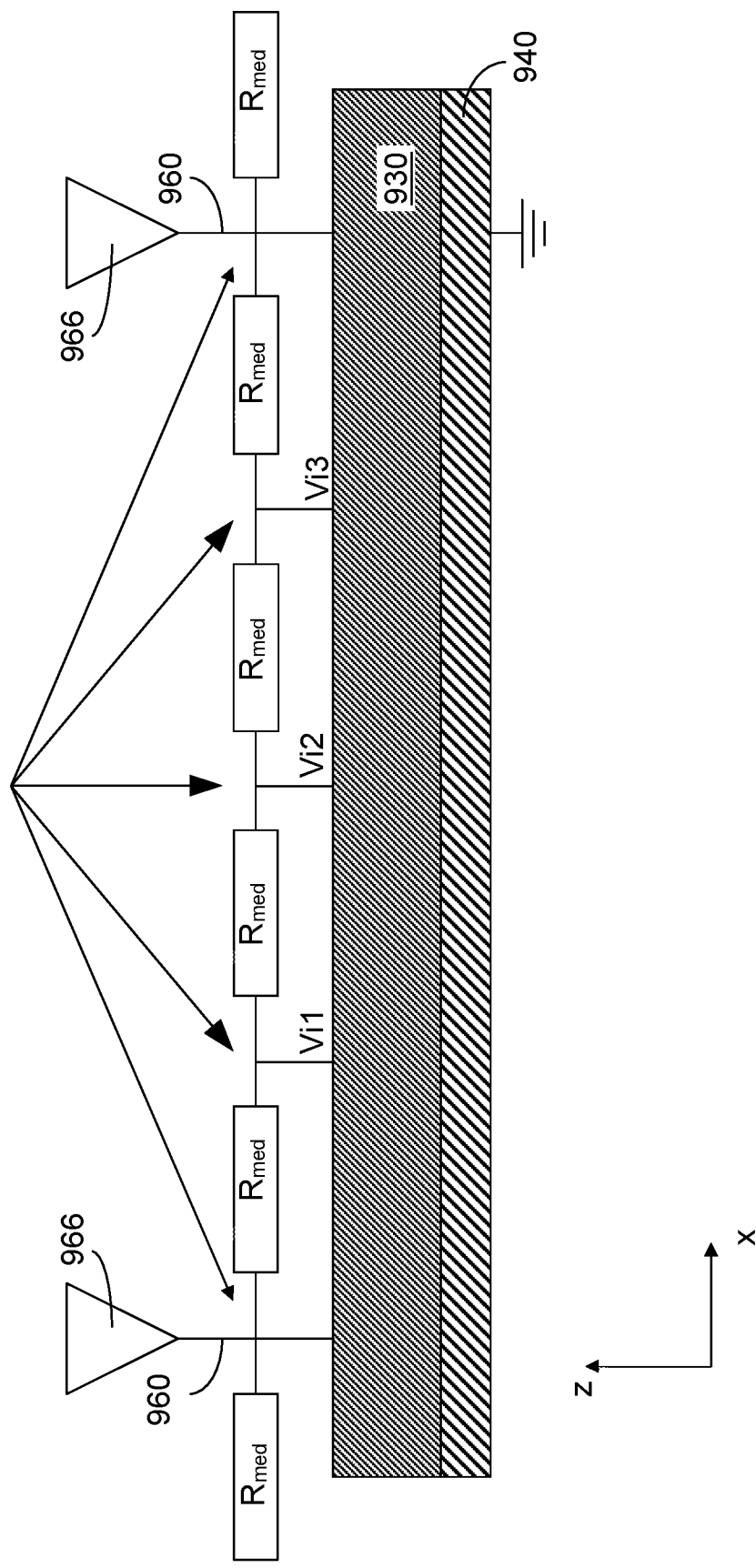
FIG. 9 shows a schematic illustration with an equivalent circuit diagram for explaining the possible construction of a conventional adaptive mirror.

In contrast to the conventional configuration described in the introduction with reference to FIG. 9, in this case the mediator layer can be described in terms of a model constituting a series circuit of capacitances or capacitors (instead of ohmic resistances in accordance with FIG. 9).

In the realization according to exemplary embodiments of the invention of the mediator layer 170 as a capacitive voltage divider, in comparison with the conventional configuration as a resistive voltage divider, the actual aim of the voltage interpolation between the electrodes 160 is achieved in the same way, but an undesired steady-state current flow in operating phases of constant electrical voltage at the electrodes 160 (i.e. in the steady state of the adaptive mirror) is avoided.

In a simple calculation example, analogously to the introductory description of FIG. 9, applying a voltage of 10 V to the left electrode 360 and 0 V to the right electrode 360 for the purpose of setting a desired deformation profile of the adaptive mirror would result in a voltage interpolation to the effect that the voltage values present at the piezoelectric layer 330 amount to Vi1=7.5V, Vi2=5V and Vi3=2.5V.

In this case, an electric current via the mediator layer modeled by the series circuit of capacitances $C_{med}$ takes place only upon charge reversal of said capacitances or a change in the voltage applied to the electrodes 360 via the driver amplifiers 366, whereas the mediator layer remains without current in the steady state of the adaptive mirror.

Figure 2:
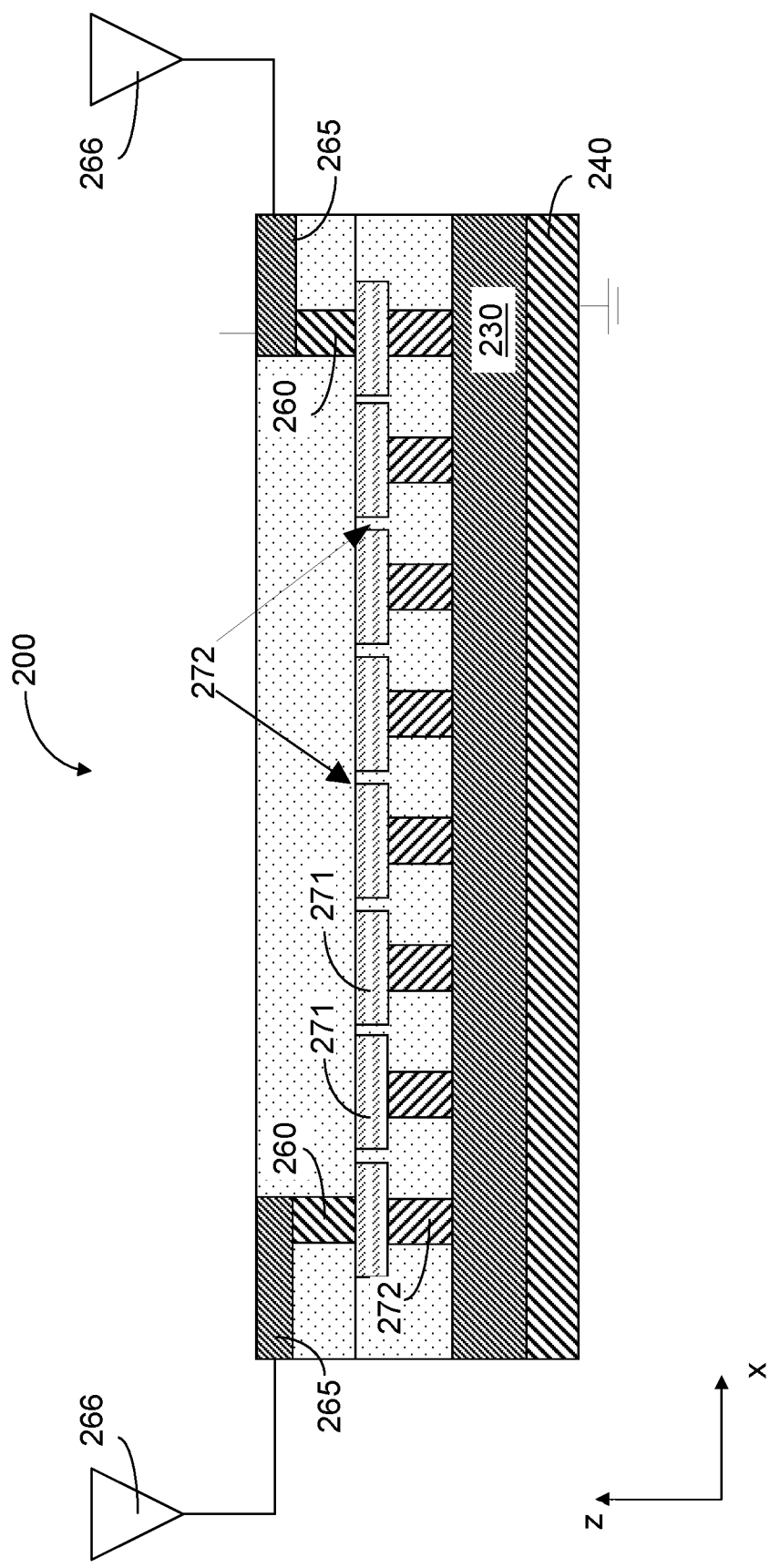
FIG. 2 shows a schematic illustration for explaining a further embodiment of an adaptive mirror according to the invention.

FIG. 2 shows a schematic illustration of a further possible embodiment of the invention, wherein components that are analogous or substantially functionally identical in comparison with FIG. 1 are designated by reference numerals increased by "100". The configuration in accordance with FIG. 2 differs from that in accordance with FIG. 1 in that the regions 271 are electrically linked to the piezoelectric layer 230 via an array of electrodes 273 specifically provided for this purpose. However, such an array of electrodes 273 is optional, in principle, and so, as illustrated in FIG. 1, the regions 171 that are electrically insulated from one another for the structuring of the mediator layer 170 can also couple directly to the piezoelectric layer 130.

Figure 3:
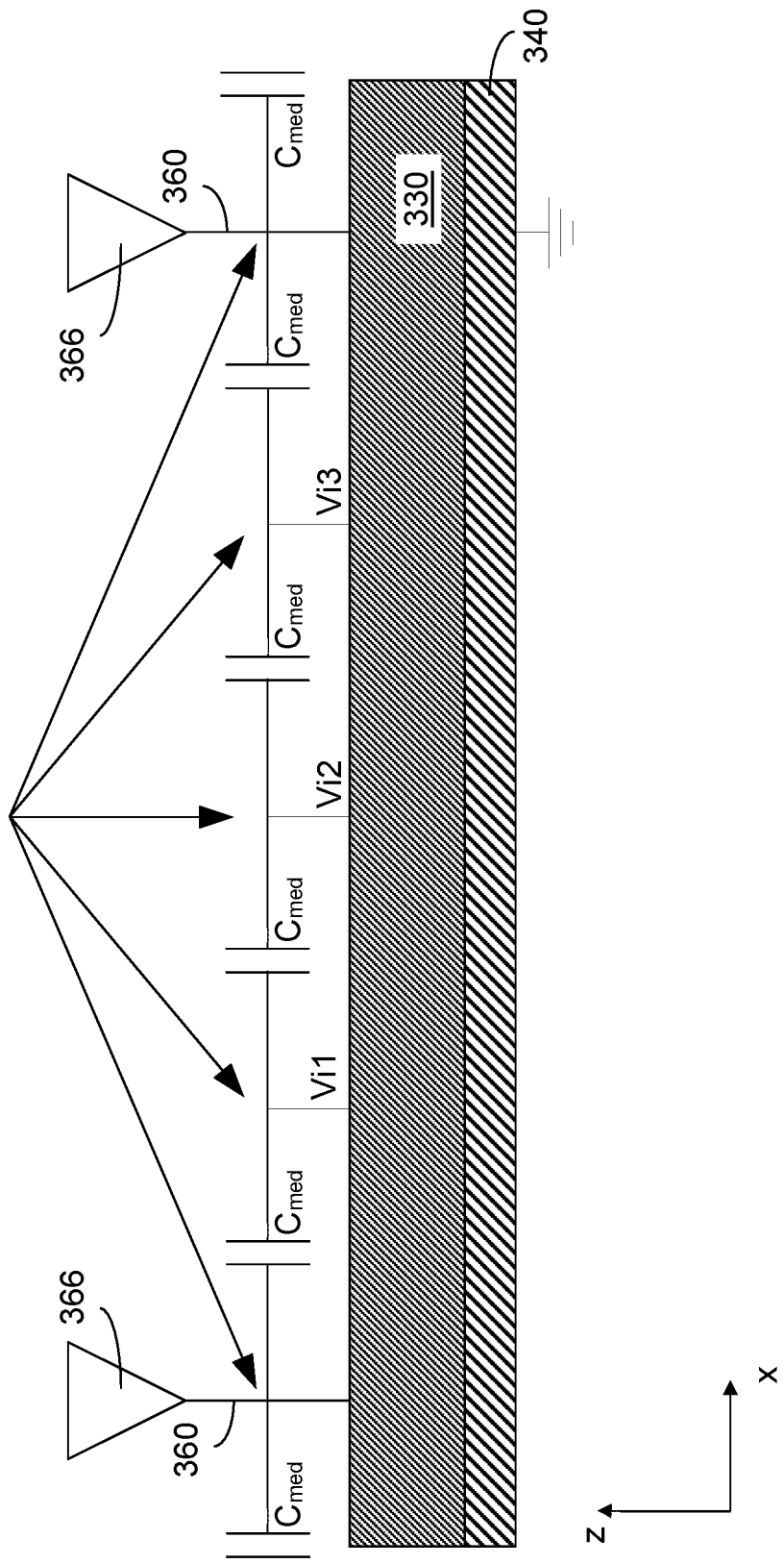
FIG. 3 shows a schematic illustration with an equivalent circuit diagram for explaining a concept underlying the invention.

It should be pointed out that the number of regions that are electrically insulated from one another for the structuring according to the invention of the mediator layer can in principle be as desired and in particular significantly higher than is illustrated in the schematic depictions in FIGS. 1-3. In particular, the structuring can be configured in such a way that the region that couples in each case two mutually adjacent electrodes of the electrode arrangement assigned to the mediator layer is subdivided into more than 50, more particularly more than 100, regions that are electrically insulated from one another.

Furthermore, the invention is in no way restricted with regard to the geometric arrangement of said regions of the mediator layer that are electrically insulated from one another. In principle, with regard to this geometry, it is possible to choose a configuration which is advantageous with respect to the best possible capacitive coupling and/or the closest possible packing of the regions insulated from one another.

Figure 4A:
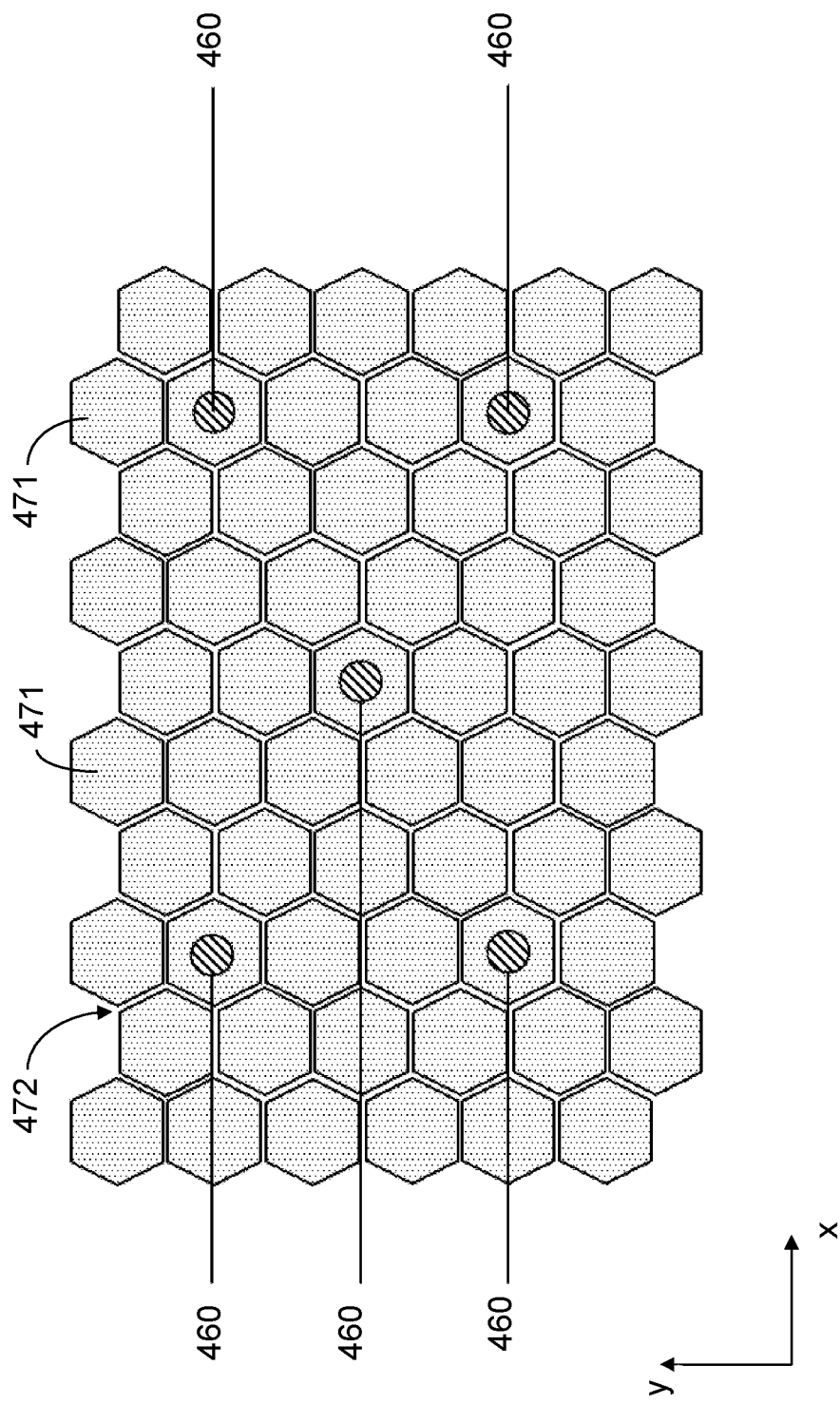
FIGS. 4A, 4B, 5 and 6 show schematic illustrations for explaining various exemplary configurations of a structuring of a mediator layer in an adaptive mirror according to the invention, in which, specifically.
Figure 4B:
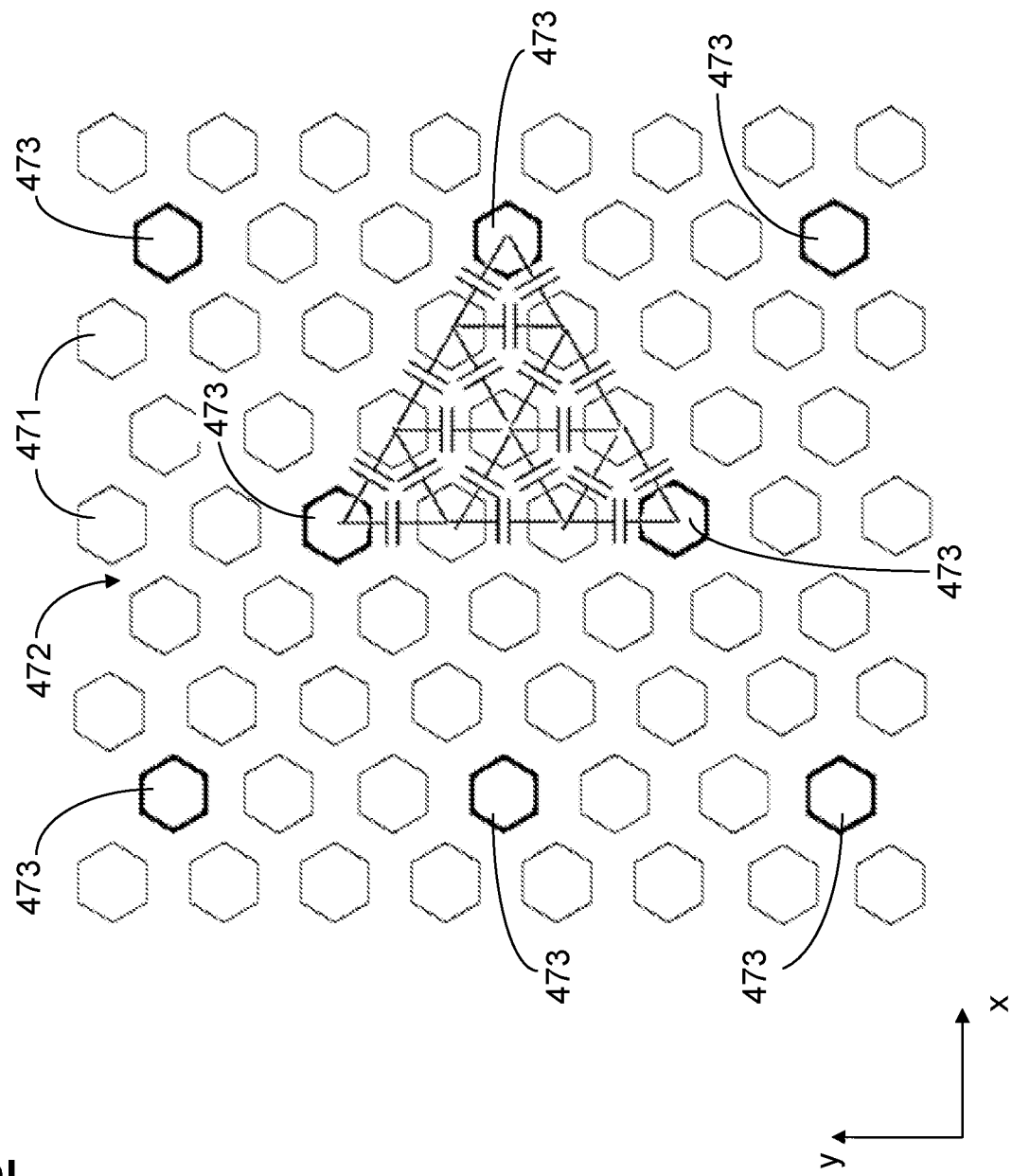

FIGS. 4A and 4B show, in a merely schematic illustration and in plan view, one exemplary configuration with a hexagonal honeycomb structure of the mediator layer. In this case, in accordance with FIGS. 4A and 4B, the regions that are electrically insulated from one another, designated by "471", have a hexagonal geometry. The region that remains between said regions 471 and is formed from electrically insulating material is designated by "472". The electrodes of the electrode arrangement assigned to this structured mediator layer are designated by "460", those regions of the mediator layer which couple directly to an electrode 460 being separately highlighted and designated by "473" in FIG. 4B. FIG. 4B likewise illustrates schematically in plan view the capacitive coupling realized between the regions 471 and 473, respectively.

Figure 5:
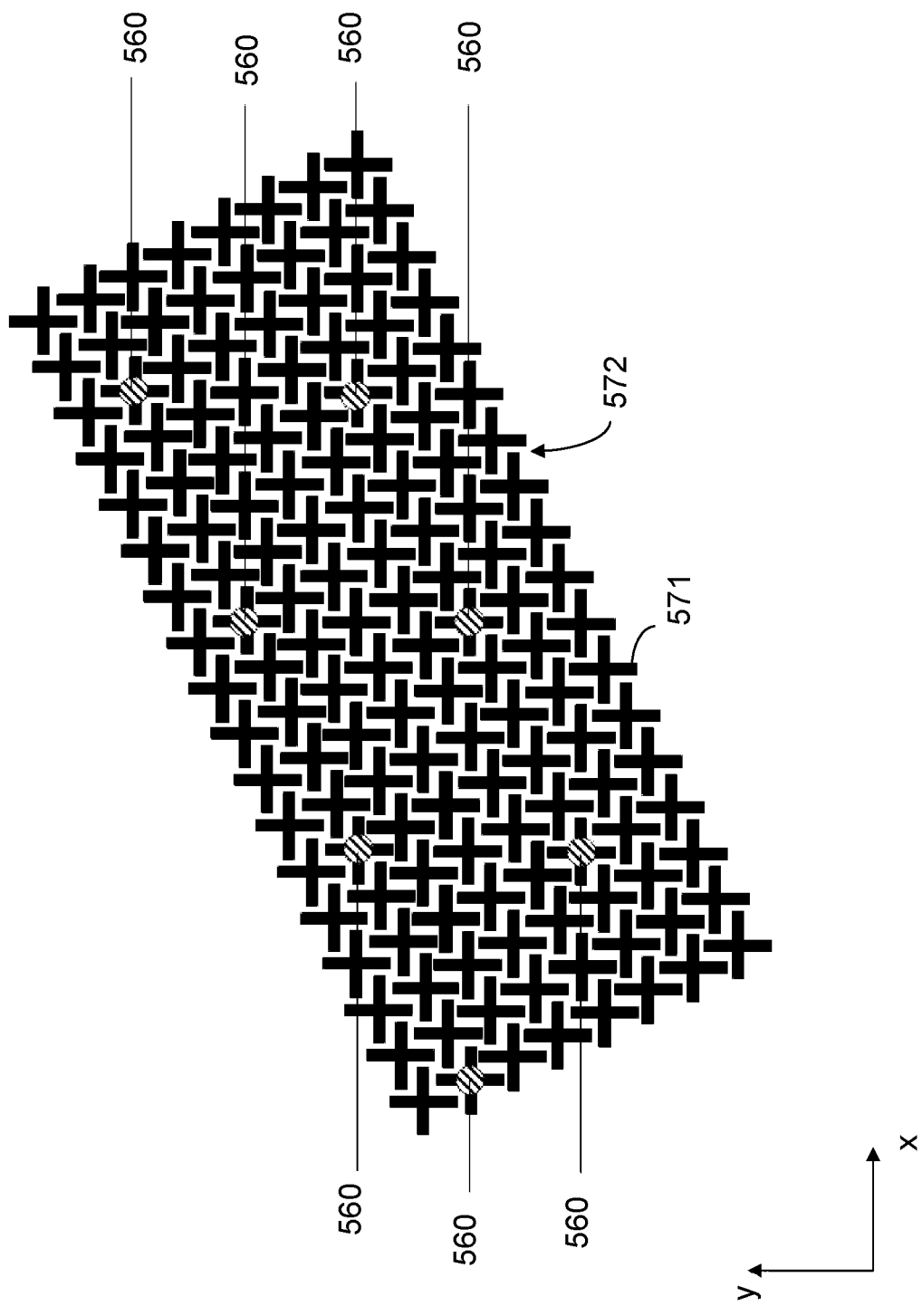
Figure 6:
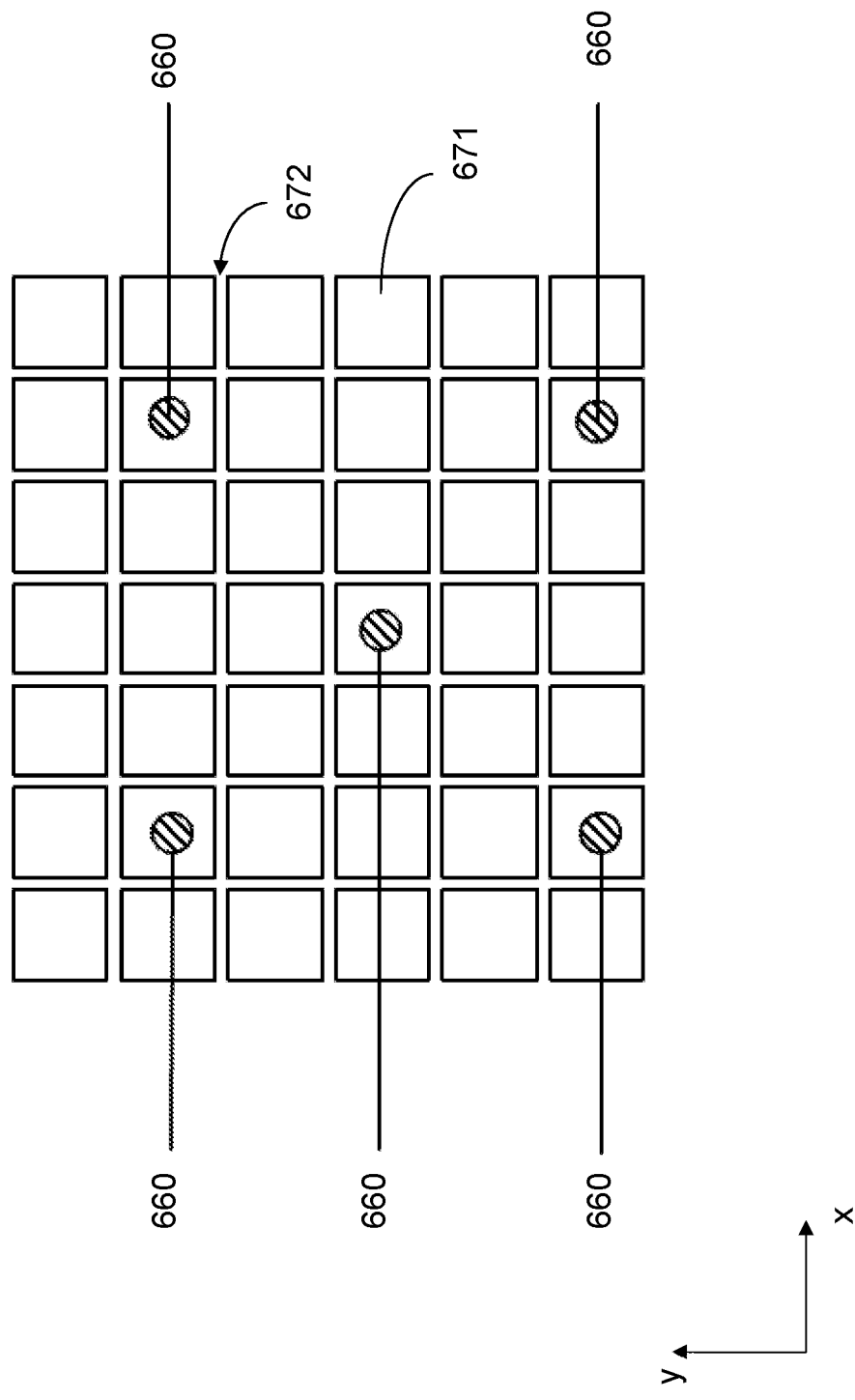

FIG. 5 and FIG. 6 show, in schematic plan views analogous to FIG. 4A, further possible geometric configurations of the structuring according to the invention of the mediator layer, wherein components that are analogous or substantially functionally identical in comparison with FIG. 4A are designated by reference numerals increased by "100" in FIG. 5 and by reference numerals increased by "200" in FIG. 6. Merely by way of example, the regions of the mediator layer that are electrically insulated from one another have a "+-shaped" geometry in accordance with FIG. 5 and a rectangular or square geometry in FIG. 6.

Figure 7:
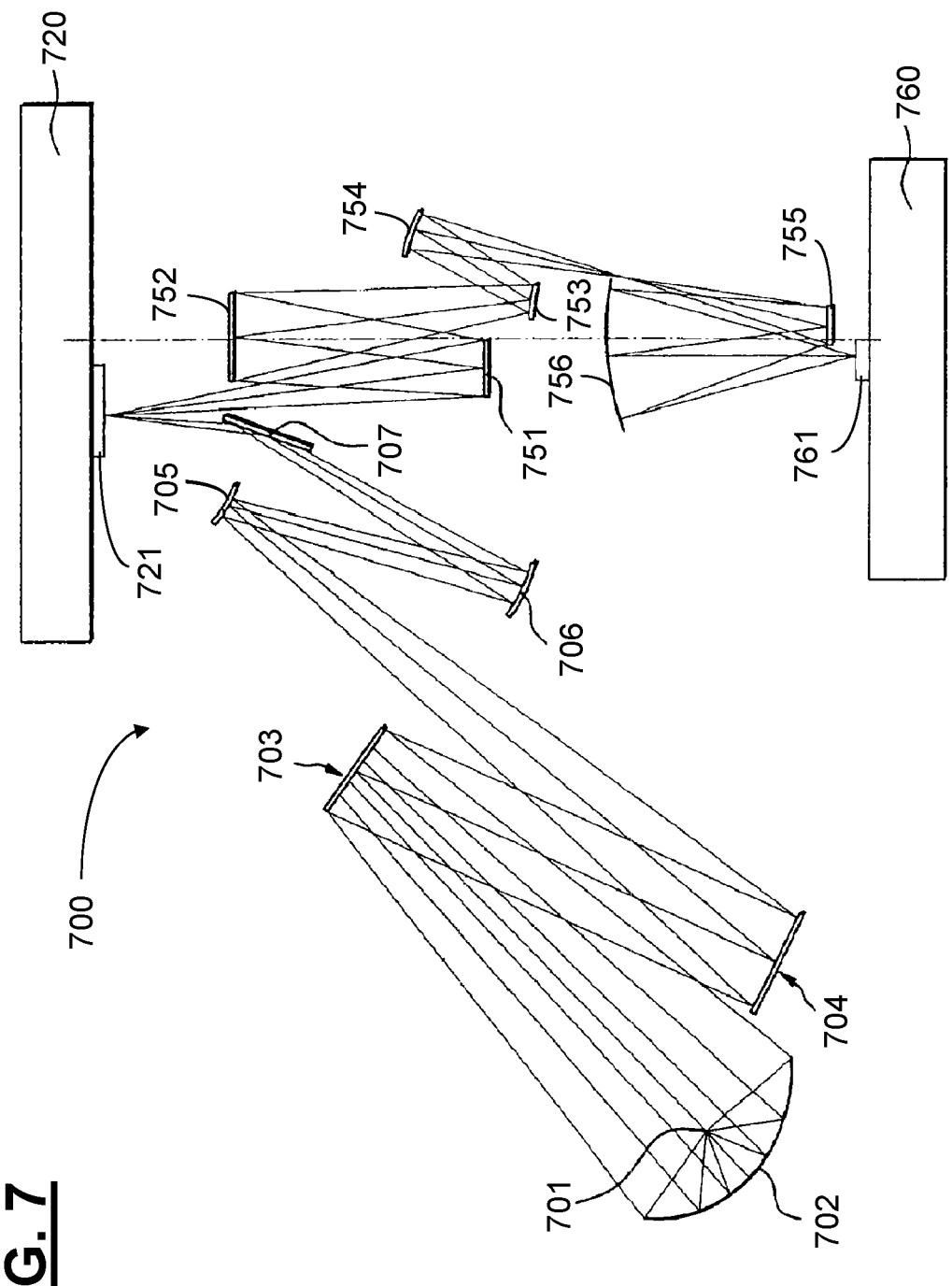
FIG. 7 shows a schematic illustration for explaining the possible construction of a microlithographic projection exposure apparatus designed for operation in the EUV.

FIG. 7 shows a schematic illustration of an exemplary projection exposure apparatus which is designed for operation in the EUV and in which embodiments of the present invention can be realized.

In accordance with FIG. 7, an illumination device in a projection exposure apparatus 700 designed for EUV comprises a field facet mirror 703 and a pupil facet mirror 704. The light from a light source unit comprising a plasma light source 701 and a collector mirror 702 is directed at the field facet mirror 703. A first telescope mirror 705 and a second telescope mirror 706 are arranged downstream of the pupil facet mirror 704 in the light path. Arranged downstream in the light path is a deflection mirror 707, which directs the radiation incident on it onto an object field in the object plane of a projection lens comprising six mirrors 751-756. At the location of the object field, a reflective structure-bearing mask 721 is arranged on a mask stage 720 and with the aid of the projection lens is projected as an image into an image plane in which a substrate 761 coated with a light-sensitive layer (photoresist) is situated on a wafer stage 760.

Figure 8:
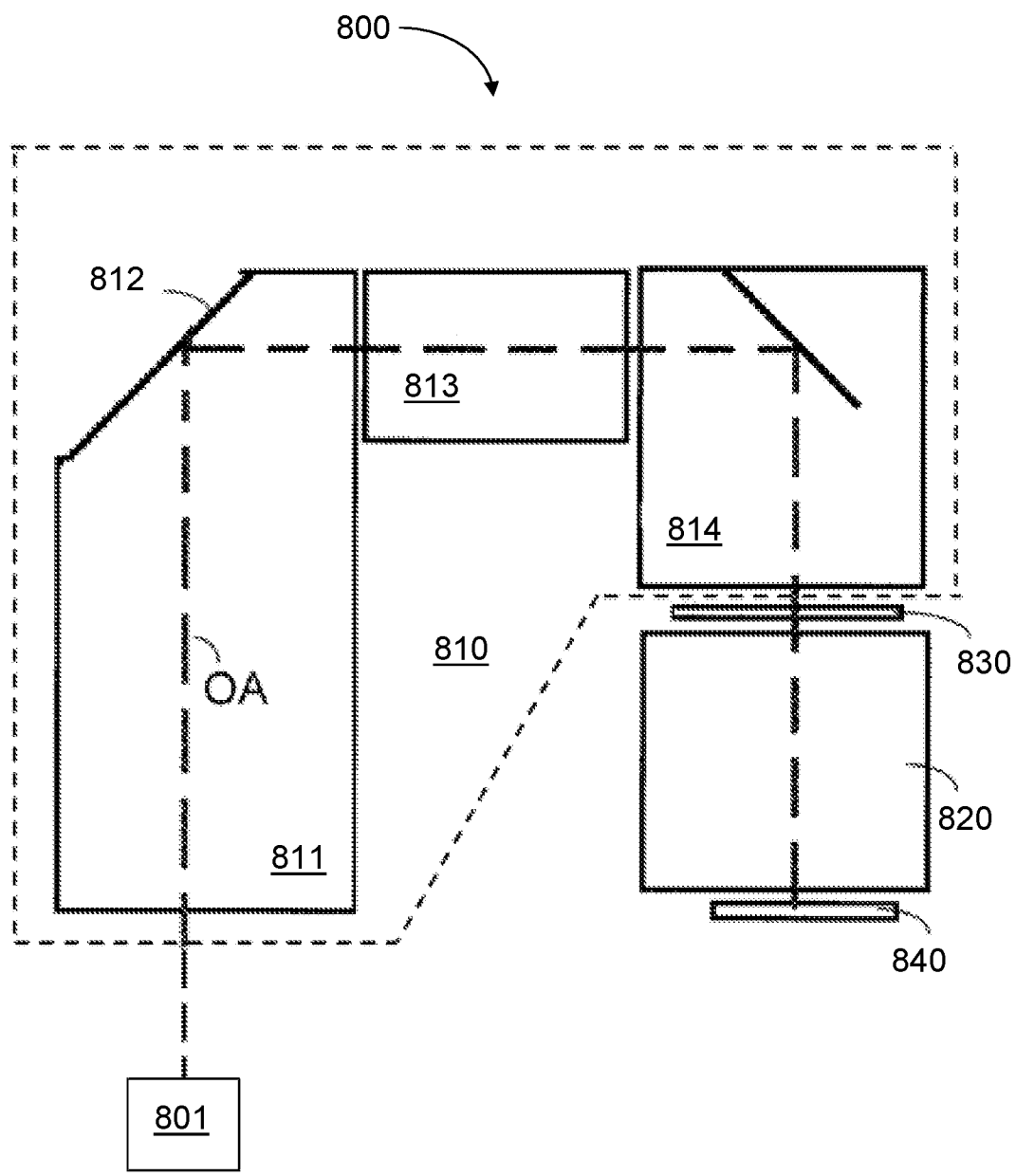
FIG. 8 shows a schematic illustration for explaining the possible construction of a microlithographic projection exposure apparatus designed for operation in the VUV.

FIG. 8 shows a construction possible in principle of a microlithographic projection exposure apparatus 800 designed for operation in a very ultraviolet (VUV) wavelength range. The projection exposure apparatus 800 comprises an illumination device 810 and a projection lens 820. The illumination device 810 serves to illuminate a structure-bearing mask (reticle) 830 with light from a light source unit 801, which for example comprises an ArF excimer laser for an operating wavelength of 193 nm and a beam shaping optical unit producing a parallel light beam. The illumination device 810 comprises an optical unit 811 which, inter alia, comprises a deflection mirror 812 in the depicted example. The optical unit 811 can comprise for example a diffractive optical element (DOE) and a zoom-axicon system for producing different illumination settings (i.e. intensity distributions in a pupil plane of the illumination device 810). A light mixing device (not illustrated) is situated in the beam path downstream of the optical unit 811 in the light propagation direction, which light mixing device can have e.g., in a manner known per se, an arrangement composed of micro-optical elements which is suitable for attaining light mixing, and a lens-element group 813, downstream of which there is a field plane with a reticle masking system (REMA), which is imaged by a REMA lens 814, disposed downstream in the light propagation direction, onto the structure-bearing mask (reticle) 830 arranged in a further field plane and which thereby delimits the illuminated region on the reticle.

By the projection lens 820, the structure-bearing mask 830 is imaged onto a substrate provided with a light-sensitive layer (photoresist) or onto a wafer 840. In particular, the projection lens 820 can be designed for immersion operation, in which case an immersion medium is situated upstream of the wafer, or the light-sensitive layer thereof, in relation to the light propagation direction. Furthermore, it can have for example a numerical aperture NA greater than 0.85, in particular greater than 1.1.

In principle, any desired mirror of the projection exposure apparatus 700 and 800 described with reference to FIG. 7 and FIG. 8, respectively, can be configured as an adaptive mirror in the manner according to the invention.

Even though the invention has also been described on the basis of specific embodiments, numerous variations and alternative embodiments will be apparent to a person skilled in the art, for example by the combination and/or exchange of features of individual embodiments. Accordingly, such variations and alternative embodiments are concomitantly encompassed by the present invention, and the scope of the invention is restricted only within the meaning of the accompanying patent claims and the equivalents thereof.

What is claimed is:

1. A mirror having an optical effective surface and comprising:
    a mirror substrate;
    a reflection layer system configured to reflect electromagnetic radiation incident on the optical effective surface;
    at least one continuous piezoelectric layer arranged between the mirror substrate and the reflection layer system;
    a first electrode arrangement situated on a side of the piezoelectric layer facing the reflection layer system, and a second electrode arrangement situated on a side of the piezoelectric layer facing the mirror substrate, wherein the first electrode arrangement and the second electrode arrangement are arranged to apply an electric field to the piezoelectric layer that produces a locally variable deformation in the piezoelectric layer; and
    a mediator layer assigned to at least one of the electrode arrangements and configured to set an at least regionally continuous profile of the electrical potential along the respective electrode arrangement;
    wherein the electrode arrangement to which the mediator layer is assigned has a plurality of electrodes, each of which is configured to apply an electrical voltage relative to the respective other electrode arrangement;
    wherein the mediator layer is structured such that, in a region that couples two respective electrodes adjacent to one another, the mediator layer is subdivided into a plurality of regions that are electrically insulated from one another; and
    wherein the number of the regions that are electrically insulated from one another in the mediator layer is greater than the number of electrodes in the electrode arrangement to which the mediator layer is assigned by at least a factor of 2.

2. The mirror as claimed in claim 1, wherein a number of the regions that are electrically insulated from one another in the region of the mediator layer that couples two adjacent ones of the electrodes to one another is more than 5.

3. The mirror as claimed in claim 2, wherein the number of the regions that are electrically insulated from one another is more than 50.

4. The mirror as claimed in claim 1, wherein the number of the regions that are electrically insulated from one another in the mediator layer is greater than the number of electrodes in the electrode arrangement to which the mediator layer is assigned by at least a factor of 10.

5. The mirror as claimed in claim 1, wherein the regions of the mediator layer that are electrically insulated from one another form a hexagonal honeycomb structure.

6. The mirror as claimed in claim 1, wherein the regions of the mediator layer that are electrically insulated from one another form a rectangular structure.

7. The mirror as claimed in claim 1, wherein the regions of the mediator layer that are electrically insulated from one another are separated from one another by an electrically insulating material situated between the regions.

8. The mirror as claimed in claim 7, wherein the electrically insulating material situated between the regions is silicon dioxide ($SiO_2$) or $Al_2O_3$.

9. The mirror as claimed in claim 7, wherein the electrically insulating material has a proportion of less than 75% of a total area of the mediator layer.

10. The mirror as claimed in claim 9, wherein the electrically insulating material has a proportion of less than 90% of the total area of the mediator layer.

11. The mirror as claimed in claim 1 and configured for an operating wavelength of less than 250 nm.

12. The mirror as claimed in claim 1 and configured for an operating wavelength of less than 30 nm.

13. The mirror as claimed in claim 1 and configured for an operating wavelength of less than 15 nm.

14. The mirror as claimed in claim 1 and configured for a microlithographic projection exposure apparatus.

15. An optical system comprising a mirror as claimed in claim 1.

16. The optical system as claimed in claim 15 and configured as an illumination device of a microlithographic projection exposure apparatus or as a projection lens of a microlithographic projection exposure apparatus.

17. A microlithographic projection exposure apparatus comprising an illumination device and a projection lens, wherein at least one of the illumination device and the projection lens comprises an optical system as claimed in claim 16.

18. The optical system as claimed in claim 15 and configured as an inspection lens.

19. The optical system as claimed in claim 18, comprising at least one of a wafer inspection apparatus comprising the inspection lens or a mask inspection apparatus comprising the inspection lens.

* * * * *